United States Patent
Cheng et al.

(10) Patent No.: US 7,445,987 B2
(45) Date of Patent: Nov. 4, 2008

(54) OFFSET VERTICAL DEVICE

(75) Inventors: Kangguo Cheng, Beacon, NY (US);
Ramachandra Divakaruni, Ossining, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/756,927

(22) Filed: Jun. 1, 2007

(65) Prior Publication Data
US 2007/0224757 A1    Sep. 27, 2007

Related U.S. Application Data

(62) Division of application No. 10/813,352, filed on Mar. 30, 2004, now Pat. No. 7,247,905.

(51) Int. Cl.
*H01L 21/8242* (2006.01)
*H01L 21/20* (2006.01)

(52) U.S. Cl. ............ 438/243; 438/244; 438/386; 438/387

(58) Field of Classification Search .......... 438/243, 438/244, 246, 386, 387
See application file for complete search history.

(56) References Cited

U.S. PATENT DOCUMENTS

| | | | |
|---|---|---|---|
| 5,629,226 A * | 5/1997 | Ohtsuki | 438/389 |
| 5,753,526 A * | 5/1998 | Ozaki | 438/246 |
| 6,214,686 B1 | 4/2001 | Divakaruni et al. | |
| 6,387,773 B1 | 5/2002 | Engelhardt | |
| 6,566,191 B2 * | 5/2003 | Hsu et al. | 438/243 |
| 6,570,207 B2 | 5/2003 | Hsu et al. | |
| 6,605,838 B1 | 8/2003 | Mandelman et al. | |
| 2003/0132438 A1 | 7/2003 | Jang | |
| 2005/0190590 A1 | 9/2005 | Chen et al. | |

* cited by examiner

*Primary Examiner*—Michael Trinh
(74) *Attorney, Agent, or Firm*—Scully, Scott, Murphy & Presser, P.C.; Joseph P. Abate, Esq.

(57) ABSTRACT

The present invention includes a method for forming a memory array and the memory array produced therefrom. Specifically, the memory array includes at least one first-type memory device, each of the at least one first-type memory device comprising a first transistor and a first underlying capacitor that are in electrical contact to each other through a first buried strap, where the first buried strap positioned on a first collar region; and at least one second-type memory cell, where each of the at least are second-type memory device comprises a second transistor and a second underlying capacitor that are in electrical contact through an offset buried strap, where the offset buried strap is positioned on a second collar region, wherein the second collar region has a length equal to the first collar region.

10 Claims, 15 Drawing Sheets

000000# OFFSET VERTICAL DEVICE

RELATED APPLICATION

This application is a divisional application of U.S. patent application Ser. No. 10/813,352, filed on Mar. 30, 2004 U.S. Pat. No. 7,247,905.

FIELD OF THE INVENTION

The present invention relates to electronic devices, and more particularly to a memory array comprising memory trench devices having offset buried strap regions, where each memory trench device is optimized for increased capacitance.

BACKGROUND OF THE INVENTION

Dynamic Random Access Memory (DRAM) cells are well known. A DRAM cell is essentially a capacitor for storing charge and an access transistor (also called a pass gate) for transferring charge to and from the capacitor. Data (1 bit) stored in the cell is determined by the absence or presence of charge on the storage capacitor. Because cell size affects chip density, size and cost, reducing cell area is one of the DRAM designer's primary goals.

One way to accomplish this density goal without sacrificing storage capacitance is to use trench capacitors in the cells. Trench capacitors can be formed by etching deep trenches in a silicon substrate and forming vertically orientated capacitors within each deep trench. Thus, the surface area required for the storage capacitor is dramatically reduced without sacrificing capacitance, and correspondingly, storable charge. In order to further decrease cell area, the access transistor may also be vertically orientated. The source of the vertical access transistor is a buried strap, which electrically connects the vertical access transistor to the underlying capacitor.

In typical memory array designs, the adjacent memory devices must be substantially separated to ensure that the buried strap regions of adjacent memory devices do not interact and cause buried strap leakage, where buried strap leakage disadvantageously reduces data retention time.

Referring to the prior memory array depicted in FIG. 1, buried strap leakage occurs between adjacent memory trench devices 14 (also referred to as memory cells) when the devices are positioned in close proximity to each other and allow for electrical interaction between the buried strap regions 15 of adjacent memory trench devices 14. Each memory trench device 14 typically comprises at least a trench capacitor 20 and a vertical transistor 10.

Referring to FIG. 2, in one prior memory array, buried strap leakage may be reduced by offsetting the buried strap regions 15 of each memory trench device 17, 18, where the offset increases the distance separating the adjacent buried strap regions 15. In prior memory arrays, the offset buried strap memory device 17 also comprises a recessed oxide collar 16, where the top surface of the recessed oxide collar 16 is at a greater depth from the top surface of the substrate 7 than the top surface of oxide collar 19 of the adjacent memory trench device 18.

Oxide collars 16, 19 are utilized to suppress parasitic leakage by controlling the threshold voltage of a parasitic transistor, which is formed between the buried strap 15 and the electrode material of the capacitor 20 in each trench device. In order to suppress parasitic leakage, the oxide collar 16, 19 must be greater than a minimum oxide collar length L1. Therefore, the recessed oxide collar 16 must be greater than the minimum oxide collar length L1 in order to suppress parasitic leakage in devices 17, 18.

Still referring to FIG. 2, memory trench devices 18 having oxide collars 19 that are not recessed are disadvantageously not optimized for maximum capacitance; because the greater length L2 of the oxide collar 19 effectively reduces the size of the underlying capacitor 20. In addition, the greater length of L2 causes increased external resistance of the filled trench poly and thus slows down memory read/write operation. Therefore, a tradeoff exists in prior memory array designs, where offsetting the buried strap 15 may suppress the loss of the storage charge due to buried-strap leakage, but at the expense of capacitor area, which reduces capacitance.

In view of the prior art mentioned above, a memory array comprising memory trench devices that are optimized for maximum capacitance and memory array density is needed.

SUMMARY OF THE INVENTION

An object of the present invention is to provide a memory array comprising vertical trench devices having suppressed buried-strap leakage and maximum capacitance. The term "maximum capacitance" is meant to denote a capacitance ranging from about $20 \times 10^{-15}$ farads to about $40 \times 10^{-15}$ farads. It is another object of the present invention to provide a memory array comprising memory trench devices (also referred to as memory cells) having offset buried straps, equal length offset collars, and offset bottling.

These and other objectives are achieved in the present invention by providing memory trench devices having buried strap regions that are offset from the buried strap regions of adjacent memory trench devices, where oxide collars in each memory trench device are of equal length. The simultaneous application of offset buried strap regions and equal length oxide collars provides decreased spacing between adjacent memory devices and maximum capacitance. Additionally, the capacitance of the memory trench devices may be further increased by capacitor regions having offset bottled regions utilized in combination with the offset buried strap regions and equal length oxide collars. Broadly, the inventive memory cell array comprises:

at least one first-type memory device, each of the at least one first-type memory device comprises a first access transistor and a first underlying capacitor that are in electrical contact to each other through a first buried strap, the first buried strap positioned on a first collar region; and at least one second-type memory device, each of the at least one second-type memory device comprises a second access transistor and a second underlying capacitor that are in electrical contact through an offset buried strap, the offset buried strap positioned on a second collar region, wherein the second collar region has a length equal to the first collar region.

The memory array may also include at least one other-type of memory device, each of the at least one other-type of memory device comprising another transistor and another underlying capacitor that are in electrical contact to each other through a further-offset buried strap, the further-offset buried strap positioned on another collar region, wherein the other collar region has a length equal to the second collar region and the first collar region.

Another aspect of the present invention is a method of forming the above memory array including offset buried strap regions and equal length oxide collars. Broadly, the method of present invention comprises the steps of:

etching a substrate to provide a first trench having an initial depth and a second trench having an intermediate depth to produce an offset between the first trench region and the second trench region in a vertical dimension;

forming sacrificial sidewall spacers to the initial depth of the first trench and the intermediate depth of the second trench;

etching the first trench to a first collar depth and the second trench to a second collar depth, wherein the offset between the first trench and the second trench is maintained;

forming collars within the first trench and the second trench, the collars positioned underlying the sacrificial sidewall spacers within the first trench and the second trench;

forming capacitors in the first trench and the second trench, each of the capacitors extending above a bottom surface of the collars;

recessing the collars in the first trench and the second trench, wherein recessed collars in the first trench and the second trench are of equal length;

forming buried straps atop the collars in the first trench and the second trench, wherein the buried straps of the first trench are vertically offset from the buried straps of the second trench; and forming access transistors atop the capacitors in the first trench and the second trench.

The method for forming a memory array with offset buried strap regions and equal length oxide collars may also comprise forming another trench having another-offset buried strap and equal length collars.

Compared to current designs, the present invention provides a memory array that suppresses buried strap leakage by offsetting the buried strap regions of adjacent memory trench devices, and provides optimized capacitance for each memory trench device by incorporating equal length oxide collars into each memory trench device. By utilizing equal length collars, the minimum collar length required to suppress parasitic leakage may be implemented into each memory trench device, allowing for maximum capacitor area, which provides optimized capacitance. Moreover, the equal length oxide collar enables the length of the inside poly to be the minimum collar length. Therefore, the poly resistance is reduced and thus memory read/write operation speed is enhanced.

DETAILED DESCRIPTION OF THE INVENTION

Figure 1:
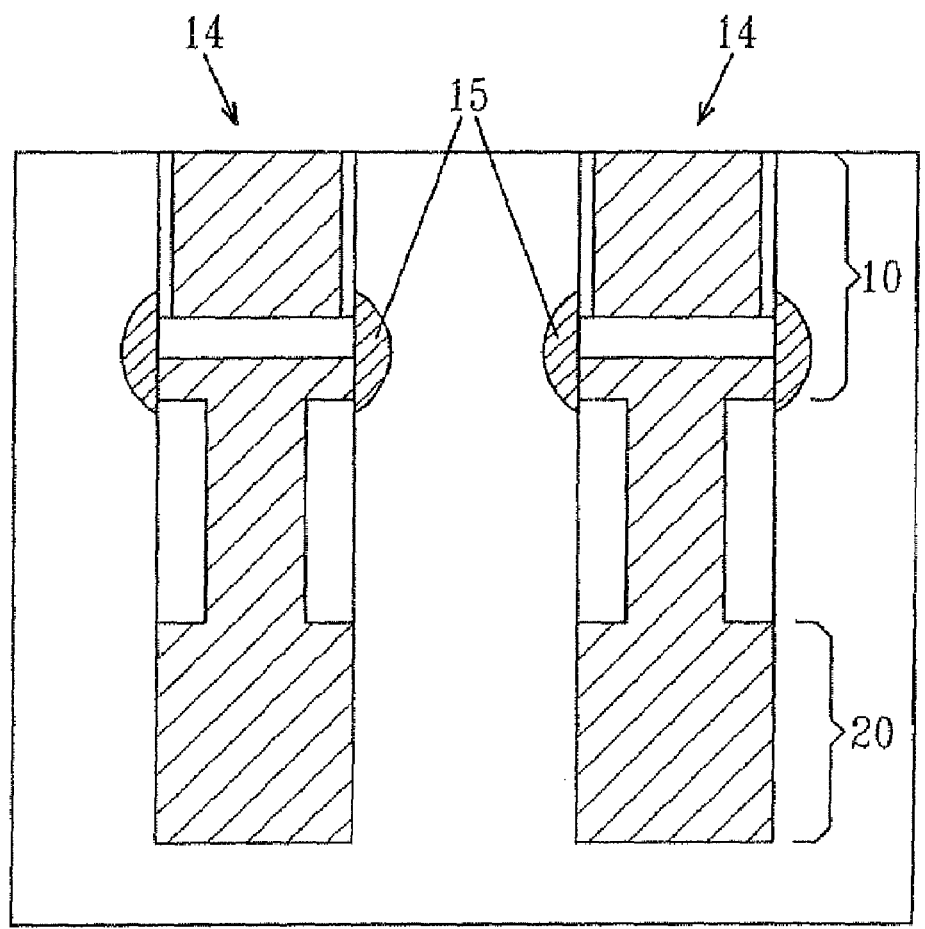
FIG. 1 illustrates (through cross-sectional view) a prior art memory array.

A memory array structure, and method of forming the same, will now be discussed in greater detail by referring to the drawings that accompany the present application. It is noted in the accompanying drawings like and corresponding parts are referred to by like reference numbers. Although the drawings show the presence of an array region containing only two memory trench devices, multiple memory trench devices are also within the scope of the present invention. Additionally, any number of array and support regions is also contemplated herein.

Figure 3:
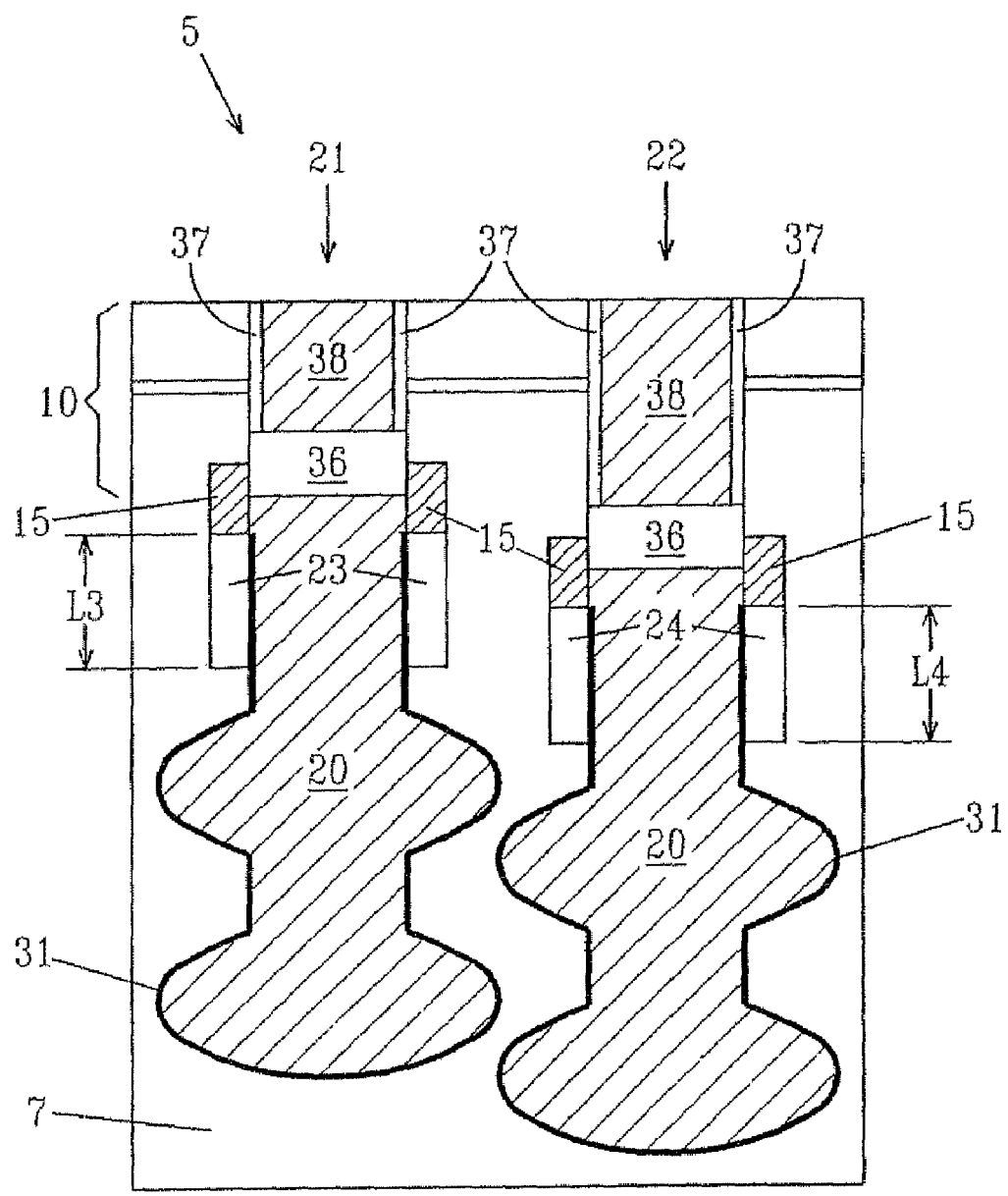
FIG. 3 illustrates (through cross-sectional view) one embodiment of the memory array of the present invention comprising offset buried strap regions and equal length collar regions.

The present invention provides a memory array comprising trench memory devices having substantially minimized buried strap leakage and maximum trench capacitance. Referring to FIG. 3, the memory array 5 comprises a substrate 7 having deep trench regions, where each deep trench region comprises a trench memory device. The term "deep trench" is meant to denote a trench having a depth of approximately 1 µm or greater from the top surface of the substrate 7.

Each memory trench device, also referred to as a memory cell, includes a trench capacitor 20 positioned in the lower portion of the deep trench and an access transistor 10 positioned atop the trench capacitor 20. The trench capacitor 20 and the access transistor 10 are in electrical contact through a buried strap 15. The present memory array 5 also comprises at least a first-type memory trench device 21 and a second-type memory trench device 22, where the buried strap 15 of the first-type memory trench device 21 is offset from the buried strap 15 of the second-type memory device 22. Offsetting the buried strap regions 15 of the adjacent memory devices 21, 22 provides minimum device spacing, while suppressing buried strap leakage and therefore provides the maximum memory array density. The term "maximum memory array density" denotes storing several gigabytes of data. The term "minimum device spacing" denotes spacing between adjacent memory devices on the order of about 100 nm or less. Typically, the buried strap 15 of the first-type memory device 21 is offset from the buried strap 15 of the second-type memory device 22 by a vertical dimension ranging from about 0.2 µm to about 0.8 µm. More typically, the offset is from about 0.4 µm to about 0.6 µm.

Figure 2:
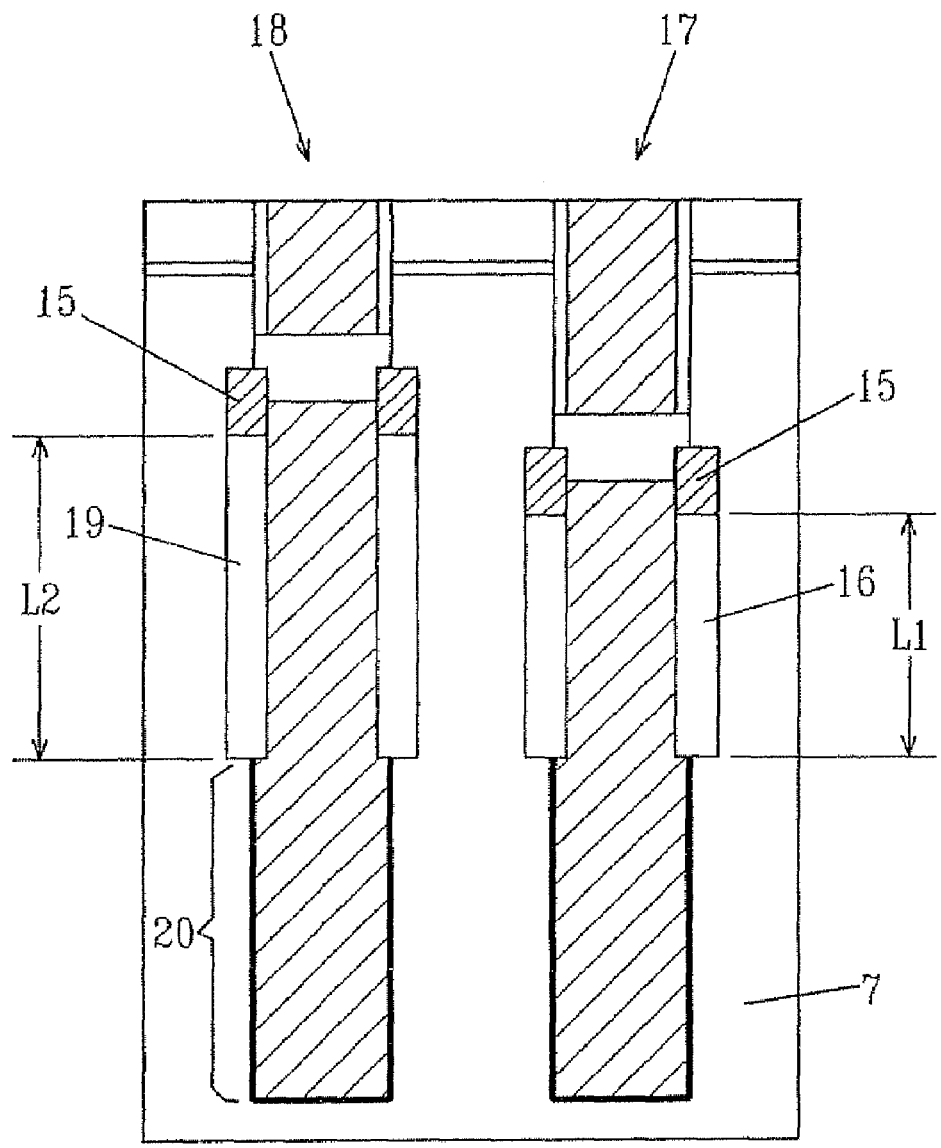
FIG. 2 illustrates (through cross-sectional view) another prior art memory array comprising offset buried strap regions and non-equal length collar regions.

In addition to offset buried strap regions 15, the present memory array 5 further comprises equal length oxide collar regions 23, 24, where the vertical length L3 of the oxide collar 23 of the first-type memory trench device 21 is equal to the vertical length L4 of the oxide collar 24 of the second-type memory device 22. Contrary to prior memory array designs having offset buried strap regions and non-equal oxide collar (L1<L2), as depicted in FIG. 2; the present memory array 5 includes offset buried strap regions 15 and equal length oxide collar 23, 24. Therefore, the present memory array allows for each memory device 21, 22 to be optimized for maximum capacitance. The present device 21, 22 further comprises trench top oxide layers 36, gate dielectrics 37, node dielectric 31, and gate conductor 38. The method for forming the memory array 5 depicted in FIG. 3 is now described in greater detail referring to FIGS. 4-14.

Figure 4:
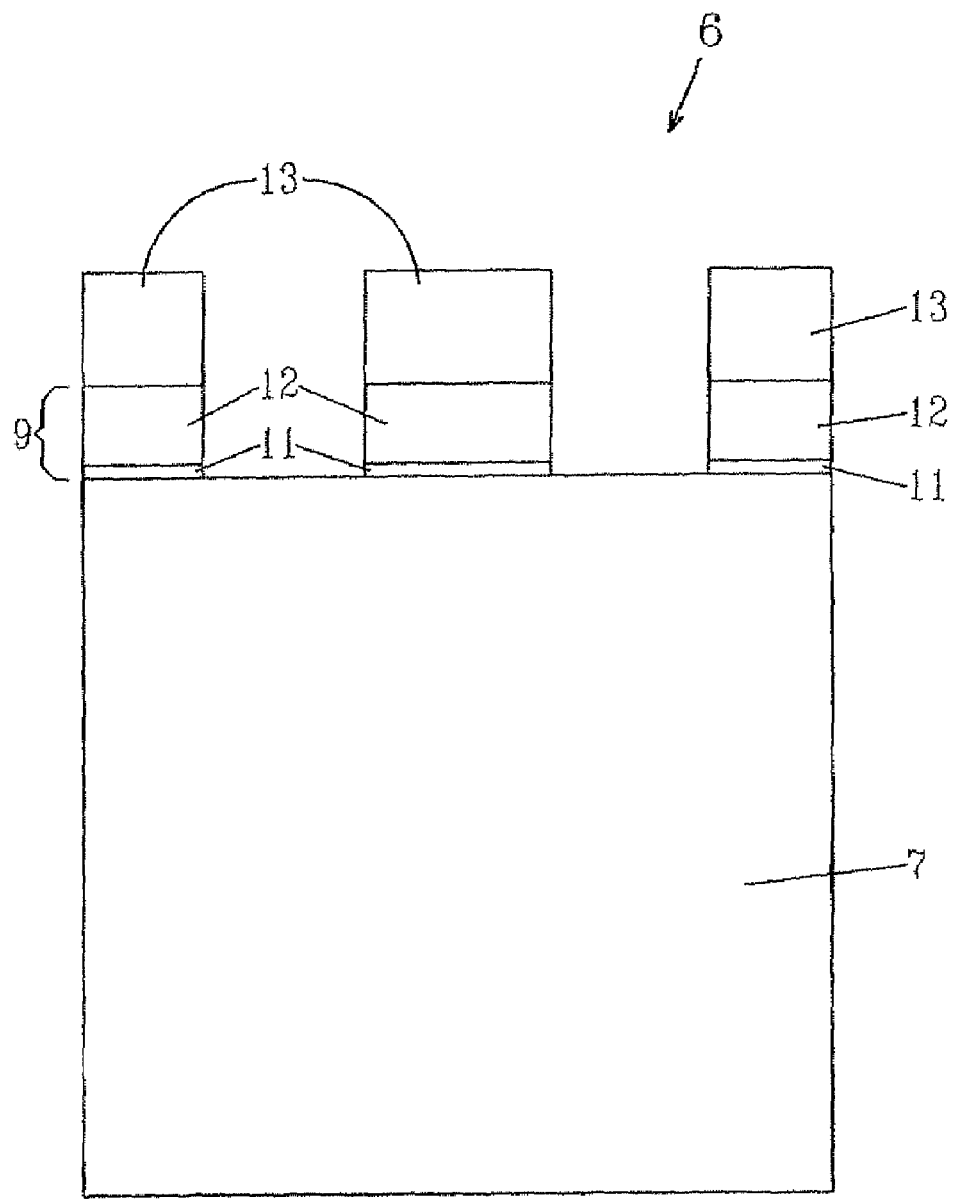
FIGS. 4-14 illustrate (through cross-sectional view) the process steps for producing the memory array depicted in FIG. 3.

Referring to FIG. 4, an initial structure 6 is provided including a substrate 7; a film stack 9, which may include an oxide layer 11 and a nitride layer 12; and a hardmask 13. The substrate 7 may comprise any semiconducting material, including but not limited to: Si, strained Si, $Si_{1-y}C_y$, $Si_{1-x-y}Ge_xC_y$, $Si_{1-x}Ge_x$, Si alloys, Ge, Ge alloys, GaAs, InAs, InP as well as other III-V and II-VI semiconductors. The substrate 7 may also be silicon-on-insulator substrates (SOI) or SiGe-on-insulator (SGOI) substrates. The thickness of the substrate is inconsequential to the present invention. Preferably, the substrate 7 comprises a Si-containing material.

The film stack 9 is formed atop the substrate 7 and may include oxide, nitride, oxynitride or any combination thereof. In a preferred example, the film stack 9 comprises a nitride layer 12 positioned atop an oxide layer 11.

The oxide layer 11 may be formed by a thermal growth process. Alternatively, the oxide layer 11 may be formed atop the substrate 7 using a conventional deposition process such as chemical vapor deposition (CVD), plasma-assisted CVD, or chemical solution deposition. The oxide layer 11 preferably comprises $SiO_2$, but may be other oxide materials including, but not limited to: $ZrO_2$, $Ta_2O_5$ or $Al_2O_3$. The oxide layer 11 may have a thickness ranging from about 2 nm to about 20 nm, preferably being about 5 nm.

A nitride layer 12 may then be formed atop the oxide layer 11 using a conventional deposition process, such as chemical vapor deposition (CVD), plasma-assisted CVD, or chemical solution deposition. The nitride layer 12 preferably comprises $Si_3N_4$. The nitride layer 12 may have a thickness ranging from about 10 nm to about 500 nm, preferably on the order of about 200 nm.

A hardmask 13 is then formed atop the pad stack 9 using conventional deposition, followed by photolithography and etching. For example, a hardmask-patterning layer may be applied to the upper surface of the pad stack 9 by chemical vapor deposition (CVD) and related methods. The composition of the hardmask-patterning layer may include silicon oxides, silicon carbides, silicon nitrides, silicon carbonitrides, etc. Spin-on methods may also be utilized to form the hardmask-patterning layer, where the spin-on applied material may include silsequioxanes, siloxanes, and boron doped silicate glass (BSG). Preferably, the hardmask-patterning layer comprises oxide materials, such as $SiO_2$, deposited by chemical vapor deposition.

A thin layer of conventional photoresist material (not shown) is then applied top the hardmask-patterning layer via spin-coating or similar processes. Following application of the photoresist layer, the photoresist is soft-baked, where the solvents of the photoresist layer are evaporated via heating. The layer of photoresist is then patterned utilizing conventional photolithography and development processing steps. Specifically, a pattern is provided by exposing the photoresist to a pattern of radiation, and then developing the pattern into the photoresist utilizing a conventional resist developer.

Once the patterning of the photoresist is completed, the sections of the hardmask-patterning layer covered by the photoresist are protected, while the exposed regions are removed using an etching process selective to removing the exposed portions of the hardmask-patterning layer without substantially etching the photoresist and the underlying pad stack. Preferably, the etch chemistry is selective to removing the $SiO_2$ of the hardmask 13 selective to the $Si_3N_4$ of the nitride layer 12 and the patterned photoresist. The patterned photoresist layer may then be stripped using a conventional chemical strip.

Following hardmask 13 formation, the exposed portions of pad stack 9 are etched to expose selected portions of the substrate 7, in which deep trenches will be subsequently formed. Typically, the etch process may be a directional etch such as: reactive ion etch. Alternatively, the hardmask 13 and the pad stack 9 may be etched together in one step selective to the photoresist. The photoresist may then be stripped.

Figure 5:
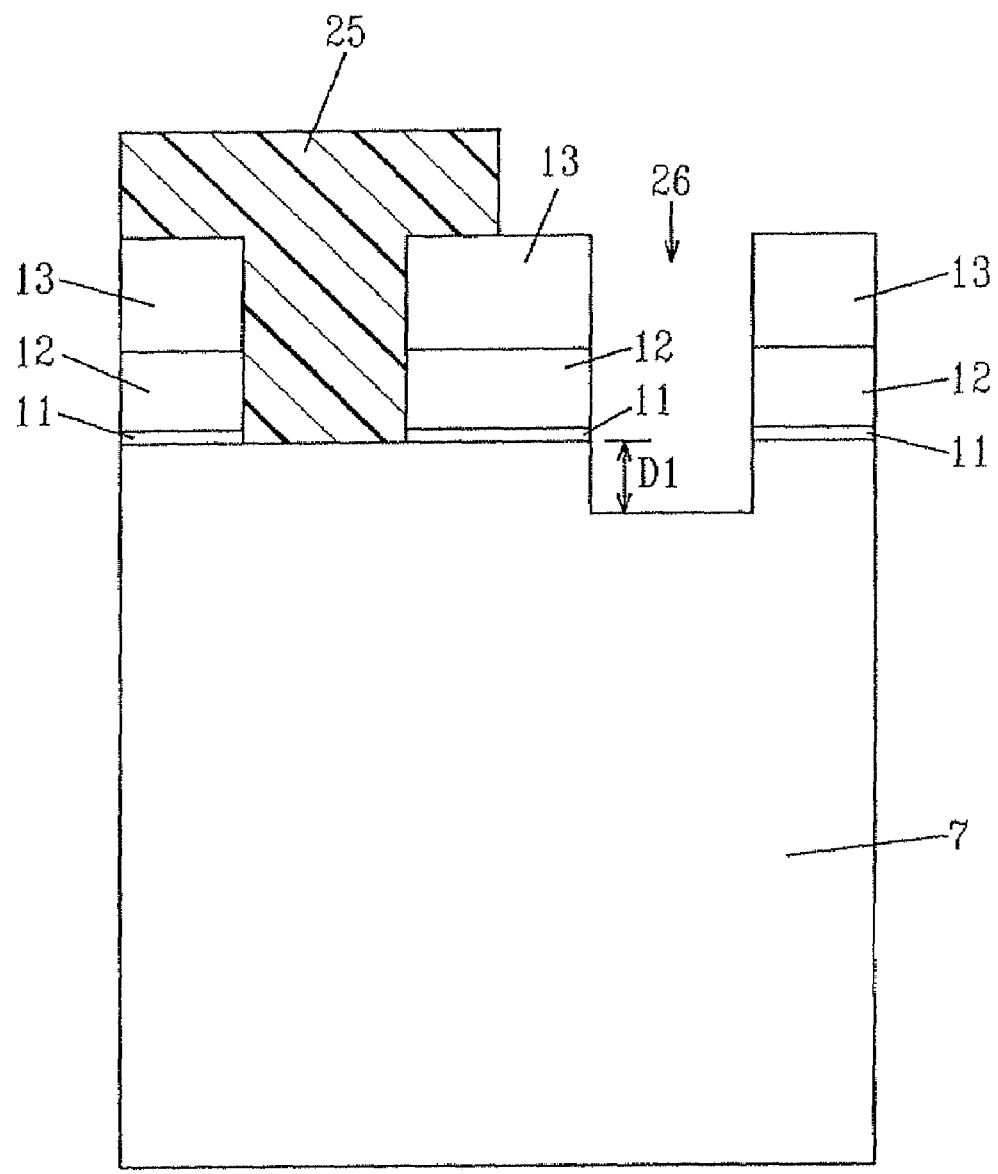

Referring now to FIG. 5, a photoresist block mask 25 is then formed overlying a portion of the memory array, where at least one other portion of the array is exposed. More specifically, a layer of photoresist is first blanket deposited atop the entire structure depicted in FIG. 4. The photoresist layer is then selectively exposed to a pattern of light and developed to form block mask 25.

The exposed regions of the substrate 7 are then selectively etched to provide the initial depth D1 of the deep-type trench 26, in which a second-type memory device will be subsequently formed, while the regions underlying the block mask 25 are protected. The deep-type trench 26 is etched to an initial depth D1 in the exposed region of the substrate 7 by a selective etch process that etches the substrate 7 selective to the block mask 25 and the hardmask 13. The initial depth D1 may range from about 0.2 µm to about 0.8 µm, preferably being from 0.4 µm to 0.6 µm.

Any directional etch process, such as reactive ion etch (RIE), may provide the initial depth D1 of the deep-type trench 26, so long as etch selectivity to removing substrate material without substantially etching the photoresist block mask 25 or hardmask 13 is maintained. The etch process may be timed, where the time period may be on the order of about 30 to 60 seconds. Following initial deep-type trench 26 processing, the block mask 25 is removed by a conventional stripping method.

Figure 6:
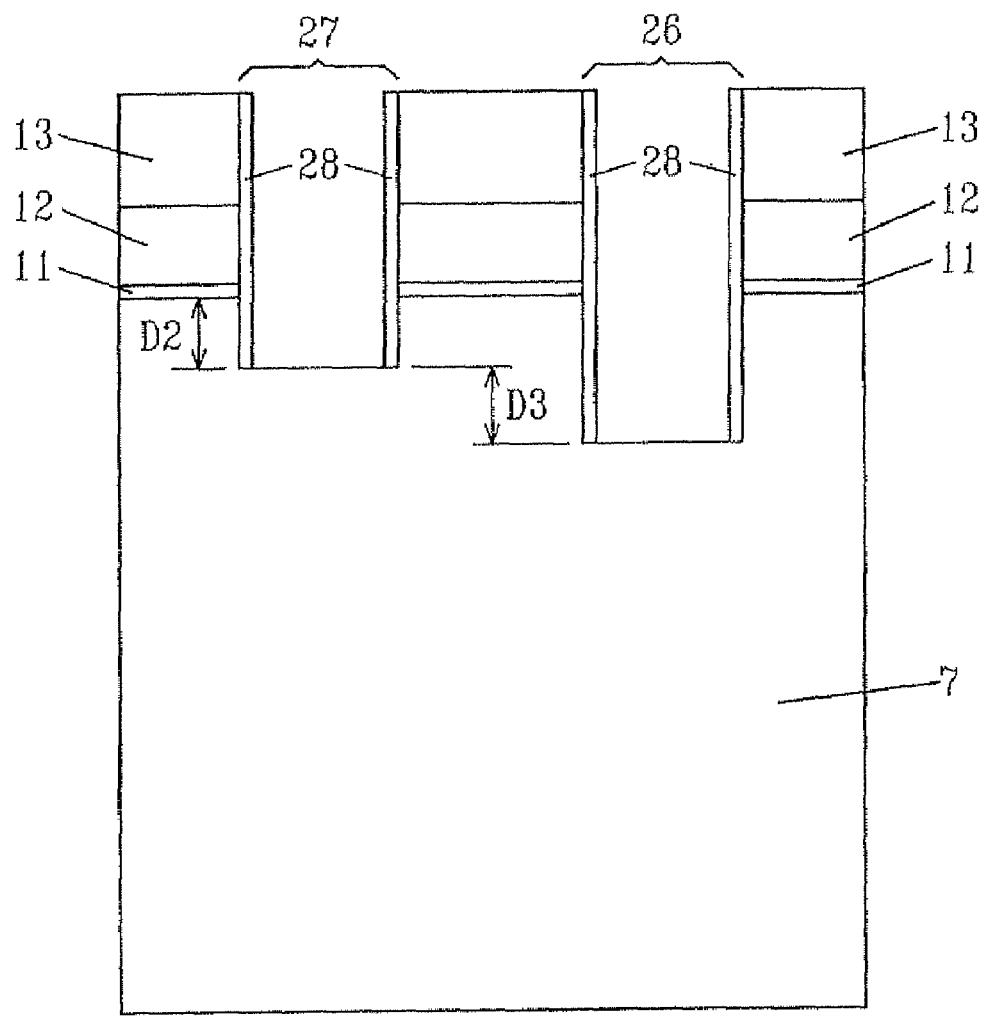

Referring now to FIG. 6, an offset-type trench 27 is then etched during a second etch process to an initial depth D2 in a portion of the substrate 7, which was previously protected by the now removed block mask. The initial depth D2 may range from about 0.2 µm to 0.8 µm, preferably being from 0.4 µm to 0.6 µm. A first-type memory device will be subsequently formed within the offset-type trench 27. Additionally, the second directional etch process further extends the deep-type trench 26 into the substrate 7. Further, the second etch process defines the depth of the subsequently formed oxide collar measured from the surface of the substrate 7 to the top surface of the equal length oxide collars in both the deep-type trench 26 and the offset-type trench 27. The initial depth of the offset-type trench 27 is offset from the deep-type trench 26, following the second etch process, by a vertical dimension D3 on the order of about 0.2 µm to about 0.8 µm, preferably being from 0.4 µm to 0.6 µm.

The second etch process may be performed by any directional etch process, such as reactive ion etch (RIE), so long as selectively is maintained to removing the substrate material without substantially etching the hardmask 13. Preferably, the etch chemistry may include fluorine-based, chlorine-based, and/or bromide-based gas chemistries having a high silicon etch rate with selectivity to oxide materials. The etch process may be timed, where the time period may be on the order of about 30 to about 60 seconds.

Still referring to FIG. 6, sacrificial spacers 28 are then formed along the sidewalls of the trenches 26, 27 by conventional deposition and etch processes. Specifically, a film layer may first be blanket deposited by chemical vapor deposition (CVD), plasma-assisted CVD, low-pressure CVD and like deposition processes. Following deposition, the film layer is then etched using conventional etch processes, including but not limited to RIE. Preferably, the film layer is $Si_3N_4$ The thickness of the sacrificial spacers 28 may range from 10 nm to 20 nm, preferably being 15 nm. Alternatively, the sacrificial spacers 28 may be oxide formed by thermal oxidation or deposition.

Figure 7:
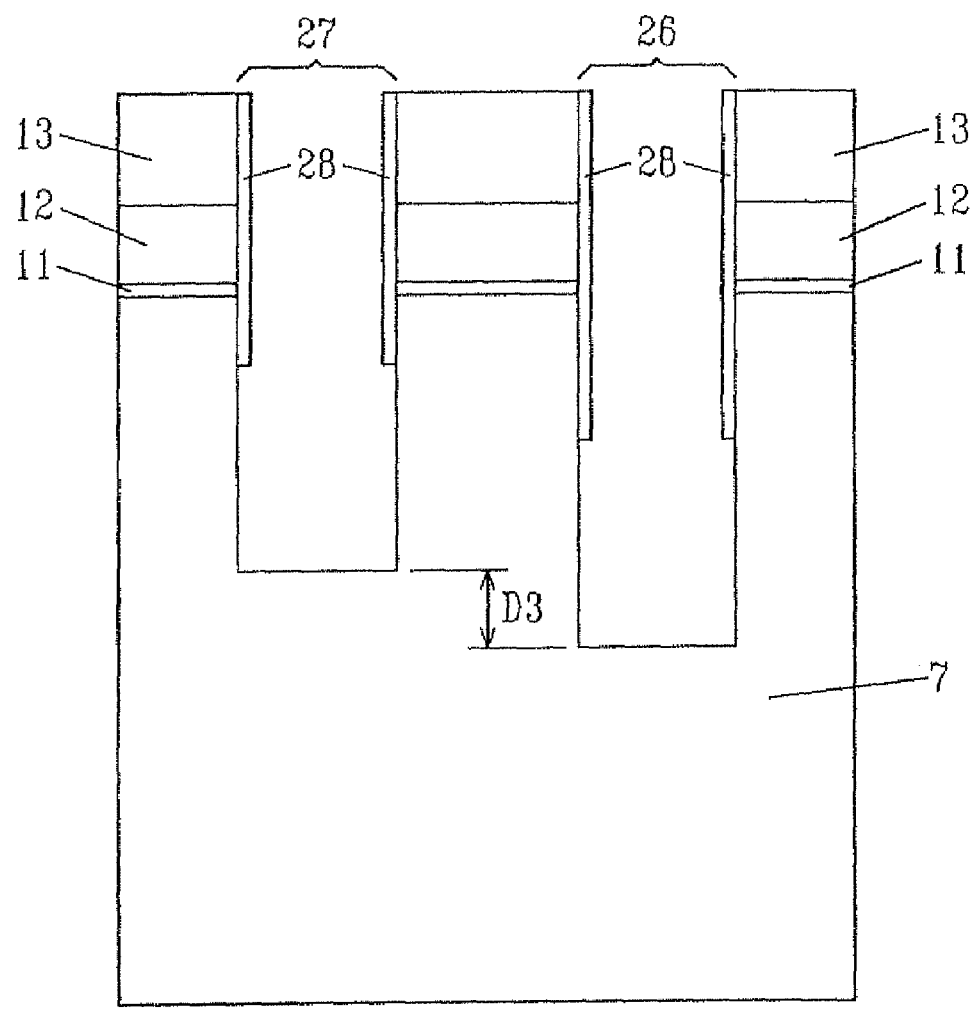

Referring to FIG. 7, a third etch process is then performed to further extend the deep-type trench 26 and offset-type trench 27 into the substrate 20. It is noted that the vertical dimension $D_3$ separating the deep-type trench 26 from the offset-type trench 27 is maintained. Further, the third etch process defines the depth of the subsequently formed equal length oxide collars measured from the surface of the substrate 7 to the bottom surface of the equal length oxide collars in both the deep type trench 26 and the offset type trench 27.

The third etch process may be any directional etch, such as RIE, so long as selectively is maintained to removing the substrate material without substantially etching the hardmask 13 or the sacrificial spacers 28. Preferably, the etch process comprises fluorine etch chemistries and is selective to removing the Si of the substrate 7 without substantially etching the oxide of the hardmask 13. The etch process may be timed, where the time period may be on the order of approximately 2 minutes.

Figure 8:
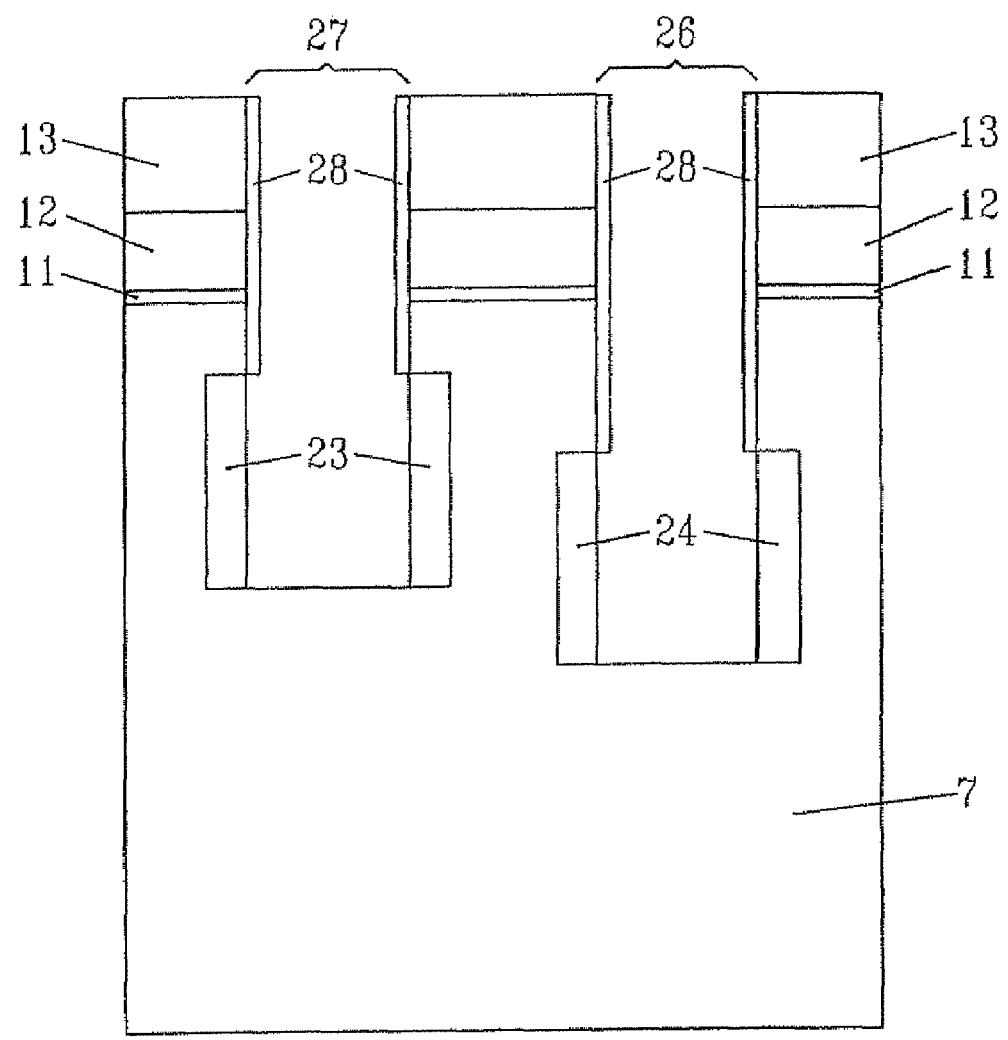

Referring to FIG. 8, oxide collars 23, 24 are then formed on the exposed sidewalls of the trenches 27, 26 by local oxidation of silicon (LOCOS). The oxide collars 23, 24 do not form on the sacrificial spacers 28. Optionally, the trench may be widened by laterally etching the substrate 7 before forming the oxide collars 23, 24.

Figure 9:
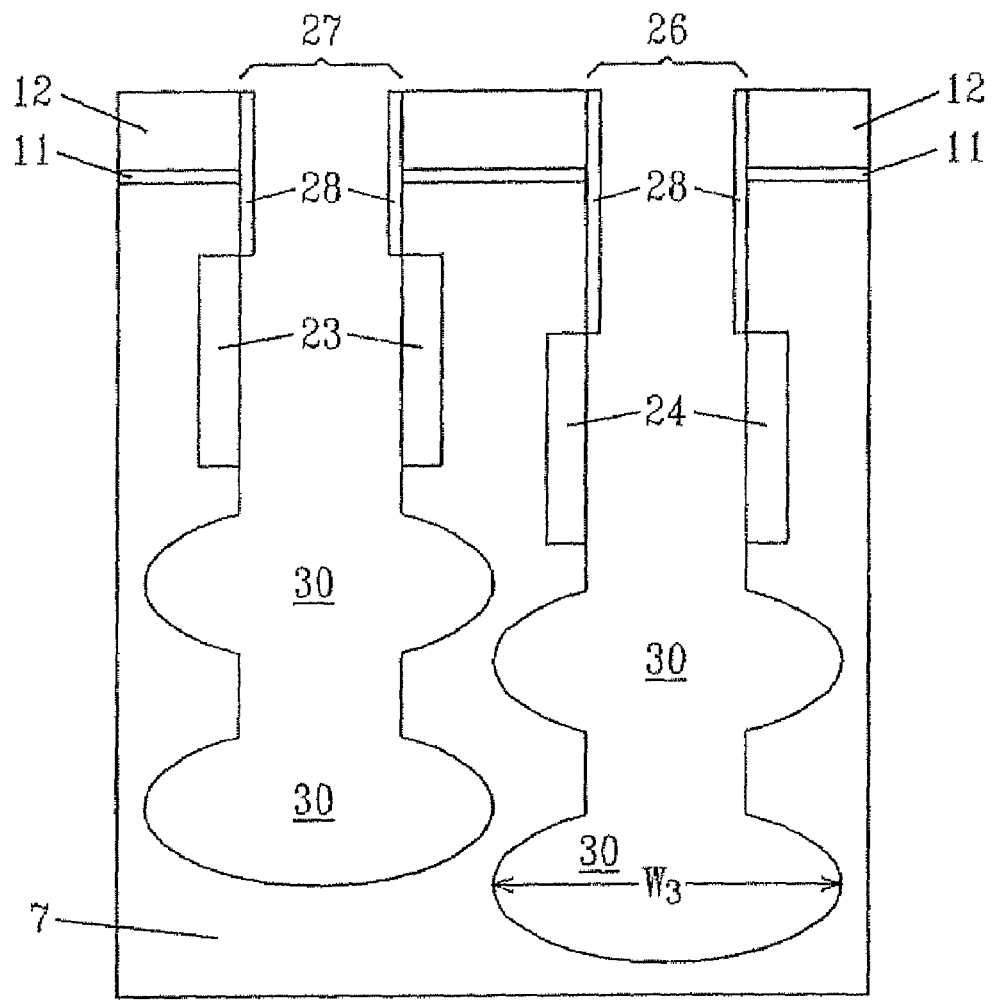

Referring now to FIG. 9, the deep-type trench 26 and offset-type trench 27 are then further etched into the substrate 7 to form the capacitor portion of the trench regions. In one embodiment of the present invention, bottling trenches may be formed to further increase each memory trench device's capacitance. The bottled shaped enlargement 30 having enlarged lateral dimensions $W_3$ are formed by varying the directional properties of the etch process. Specifically, the etch chemistry of an anisotropic etch process, such as reactive ion etch, may be varied from anisotropic to isotropic by adjusting the ratio of fluorine (F) to oxygen ($O_2$) to hydrogen bromide (HBr). The ratio of anisotropic to isotropic etching component of the plasma etching process can be set by way of ion bombardment by a selection of process parameters, such as radio frequency power, pressure, magnetic field strength and/or process gas. Examples of suitable etching gases are $NF_3$, $XeF_2$ or $SF_6$.

Multiple bulbous regions 30, for example, can be formed within the trenches 26, 27 to increase capacitance. Note that adjacent trench regions 26, 27, never touch. Therefore, there is no shorting between memory devices. Large storage node capacitance for a memory device can be gained by the formation of bottle trenches and multiple bottle shaped trenches spatially offset by a vertical dimension. The bottling enlargements 30 may be omitted.

In one embodiment of the present invention, a self-aligned buried lower plate (not shown) may be formed in a portion of the substrate 7 surrounding the lower portion of trench 26, 27, below the equal length oxide collars 23, 24. The self-aligned buried lower plate may be formed by ion implantation, where the nitride layer 12 and the oxide collar 23, 24 block diffusion of the dopant species so that the dopant is contained to the regions of the substrate 7 that is below the oxide collar 23, 24, and surrounds the trenches 26, 27. Alternatively, the dopant may be introduced by depositing a doped material into the lower portion of the trenches 26, 27 and then diffusing the dopant from the deposited doped material into the trench sidewalls. The doped material may be deposited by conventional deposition processes, such as chemical vapor deposition, and may comprise arsenic doped silicate glass. (ASG).

Since the oxide collar 23, 24 blocks dopant diffusion, the buried lower plate is self-aligned to the lower edge of the oxide collar 23, 24. Preferably, the dopant is an N-type dopant. N-type dopants in a Si substrate include, but are not limited to: As, Sb, or P. Preferably, the N-type dopant is As and the dopant concentration is greater than $1\times10^{19}$ atoms/$cm^3$.

Figure 10:
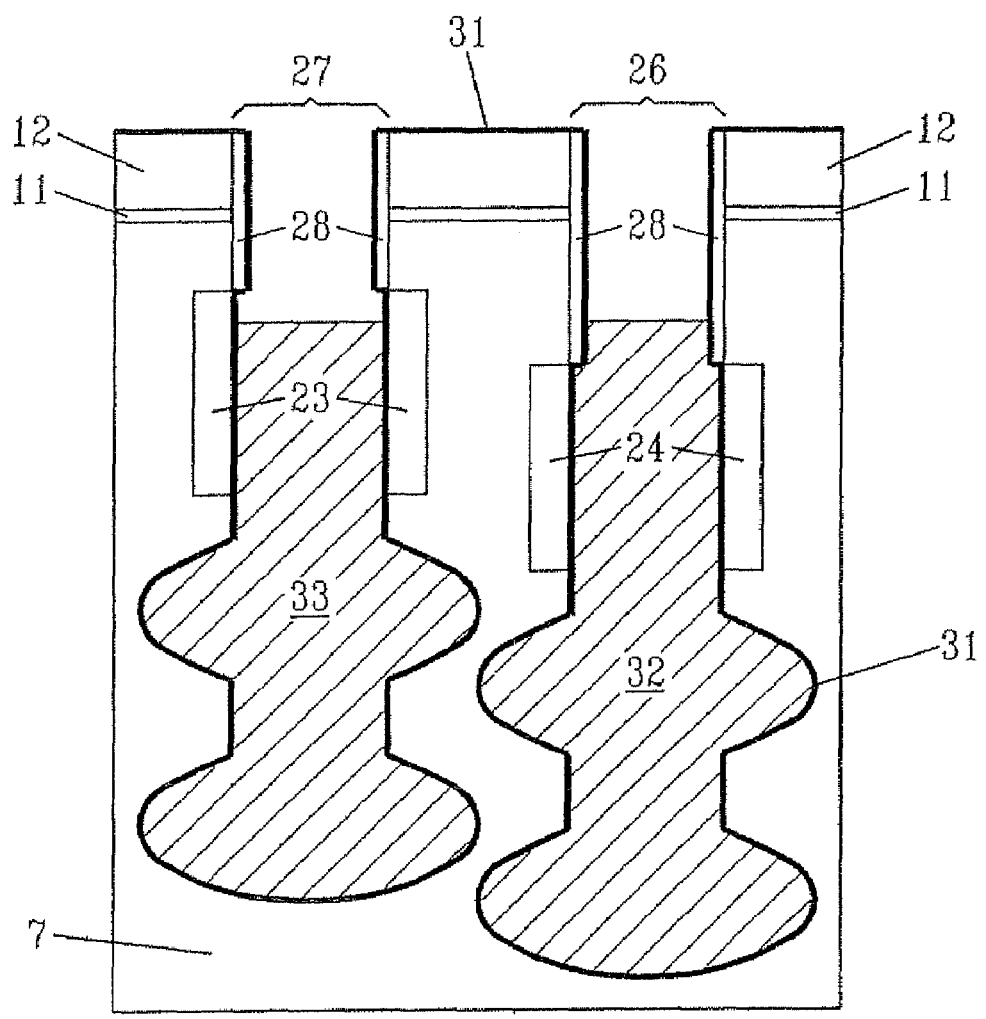

Referring now to FIG. 10, a node dielectric 31 is then conformally formed lining the trenches 26, 27. The node dielectric 31 may be formed by conventional deposition or growth processes. The node dielectric 31 material may be an oxide, oxynitride, or nitride. Preferably, a node dielectric 31 comprising nitride may be formed using a combination of thermal nitridation and chemical vapor deposition. First, a nitride seed layer is initially formed by thermal nitridation. Thereafter, a second nitride layer is deposited using low-pressure chemical vapor deposition (LPCVD). Preferably, the nitride material is $Si_3N_4$. Alternatively, a node dielectric 31 comprising oxide may be formed by thermal oxidation. The thickness of the node dielectric 31 may range from about 3 nm to about 10 nm, preferably being from about 4 nm to about 5 nm.

Still referring to FIG. 10, the trenches are then filled with a conducting material, which may be polysilicon, a metal, or any combination thereof. Polysilicon, which may be doped, is preferred for trench fill. The polysilicon, is blanket deposited using a conventional deposition process, such as LPCVD or PECVD. Preferably the deposition process is LPCVD, since LPCVD is a highly conformal deposition process. Preferably, during formation the polysilicon layer may be in-situ doped with N-type dopants, such as As, Sb, or P, preferably being As. The dopant concentration in the polysilicon layer may be on the order of about $1\times10^{20}$ atoms/$cm^3$. Following deposition, the doped polysilicon layer is then recessed in an initial polysilicon etch using a directional etch process, such as reactive ion etch. Preferably, the etch chemistry is selective to removing polysilicon without substantially etching the nitride layer 12 or the node dielectric 31. The etch chemistry may be sulfuric fluoride ($SF_6$), chlorine ($Cl_2$) or other fluorine containing etch chemistries. The initial polysilicon etch process may be timed.

Following the initial polysilicon etch process, the polysilicon in the offset-type trench 27 is recessed below the upper surface of the collar oxide 23, 24, where the top surface of the recessed polysilicon 32 in the deep-type trench 26 is at the same depth from the surface of the substrate 7 as the recessed polysilicon 33 in the offset-type trench 27. Therefore, following the initial polysilicon etch the top surface of the recessed polysilicon 33 in the offset-type trench 27 is on the same plane as the top surface of the recessed polysilicon 32 in the deep-type trench 26.

Figure 11:
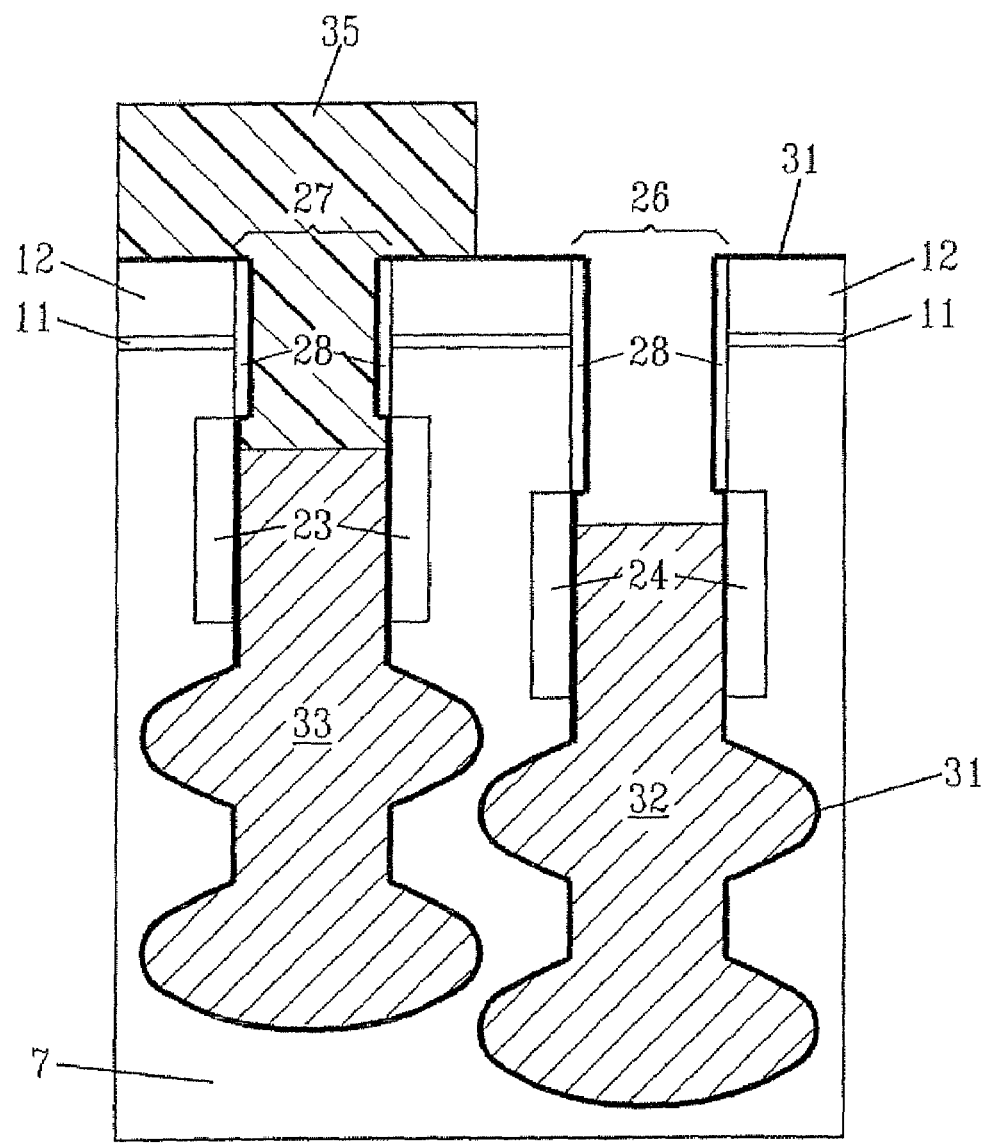

Referring to FIG. 11, a photoresist block mask 35 is then formed atop a portion of the substrate 7 including the offset-type trench 27, where a portion of the substrate 7 including the deep-type trench 26 is exposed. The polysilicon 32 within the deep-type trench 26 is then recessed below the top surface of the collar oxide 23, 24 using a conventional etch process selective to removing polysilicon without substantially etching the photoresist block mask 35, node dielectric 31 and the sacrificial nitride spacers 28. Preferably, the etch chemistry is selective to removing polysilicon without substantially etching the photoresist or the $Si_3N_4$ of the node dielectric 31 and the sacrificial nitride spacers 28. The etch chemistry may be sulfuric fluoride ($SF_6$), chlorine ($Cl_2$) or other fluorine containing etch chemistries. Following deep-type trench 26 polysilicon 32 recessing, the photoresist block mask 35 is stripped by a conventional process. The recessed polysilicon 32, 33 in the deep-type trench 27 and offset-type trench 26 is hereafter referred to as the polysilicon nodes 32, 33.

Figure 12:
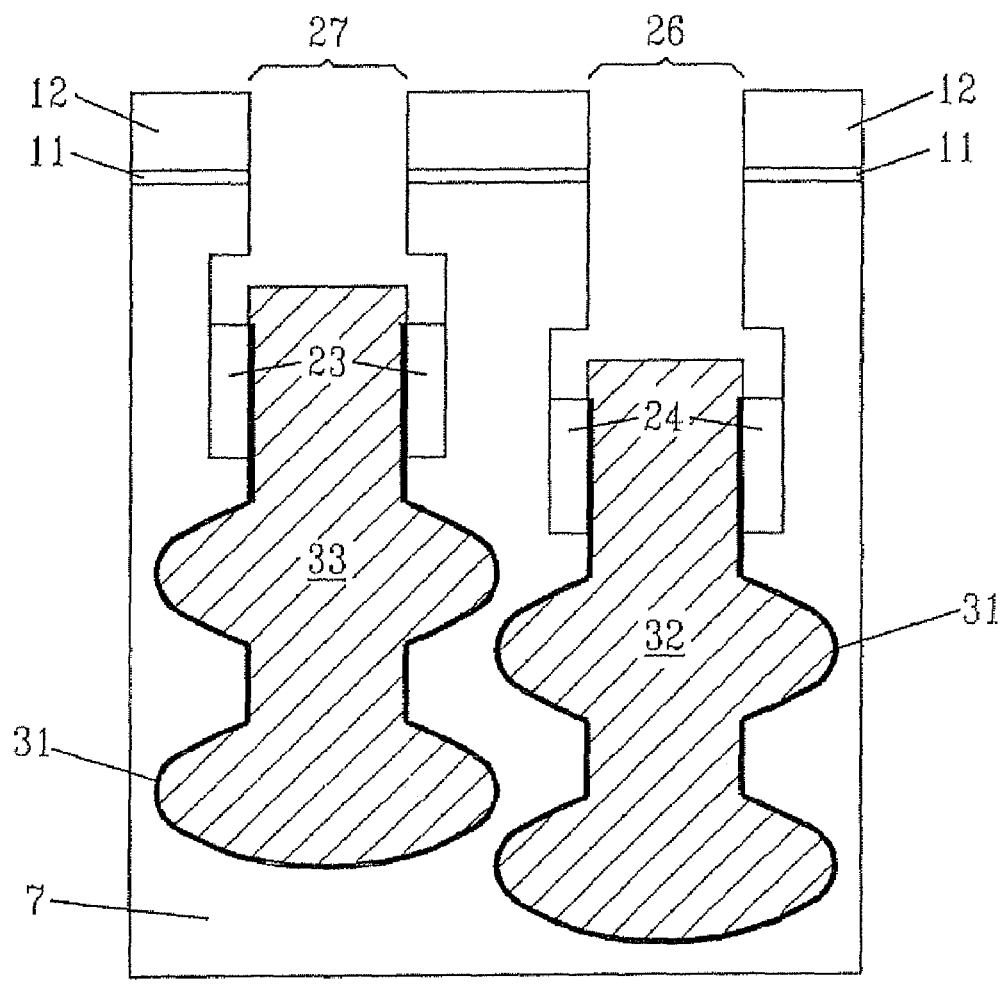

Turning to FIG. 12, an upper portion of the node dielectric 31 and the sacrificial nitride spacers 28 are then removed by a wet chemical etch selective to the polysilicon nodes 32, 33, and the substrate 7. The term "upper portion" is meant to denote the portion of the node dielectric 31 that extends above the polysilicon nodes 32, 33, in both the deep-type trench 26 and offset-type trench 27.

The sacrificial spacers 28 and the upper portion of the node dielectric 31 are removed by a conventional etch process. A portion of the nitride layer 12 may be removed in the process of removing the sacrificial spacer 28 and the upper portion of node dielectric 31. Note, that the initial thickness of the nitride layer 12 is typically about 2000 Å, while the total thickness of the sacrificial spacer 28 and the upper portion of node dielectric 31 is about 200 Å. Therefore, removing the sacrificial spacer 28 and the upper portion of the node dielectric 31 does not entirely remove the nitride layer 12.

Following upper dielectric 31 etch, the collar oxide 23, 24 is recessed by a wet chemical etch. Preferably, the wet chemical etch selectively etches the $SiO_2$ of the oxide collars 23, 24 without substantially etching the polysilicon node 32, 33 or the trench 26, 27 sidewalls. The collar oxide 23, 24 etch chemistry may comprise HF. Alternatively, the oxide collars 23, 24 may be recessed during the process of removing the sacrificial spacers 28 and the upper portion of the node dielectric 31 by using a hydrofluoric/ethylene glycol (HF/EG) chemistry, which etches both oxides and nitrides.

Figure 13:
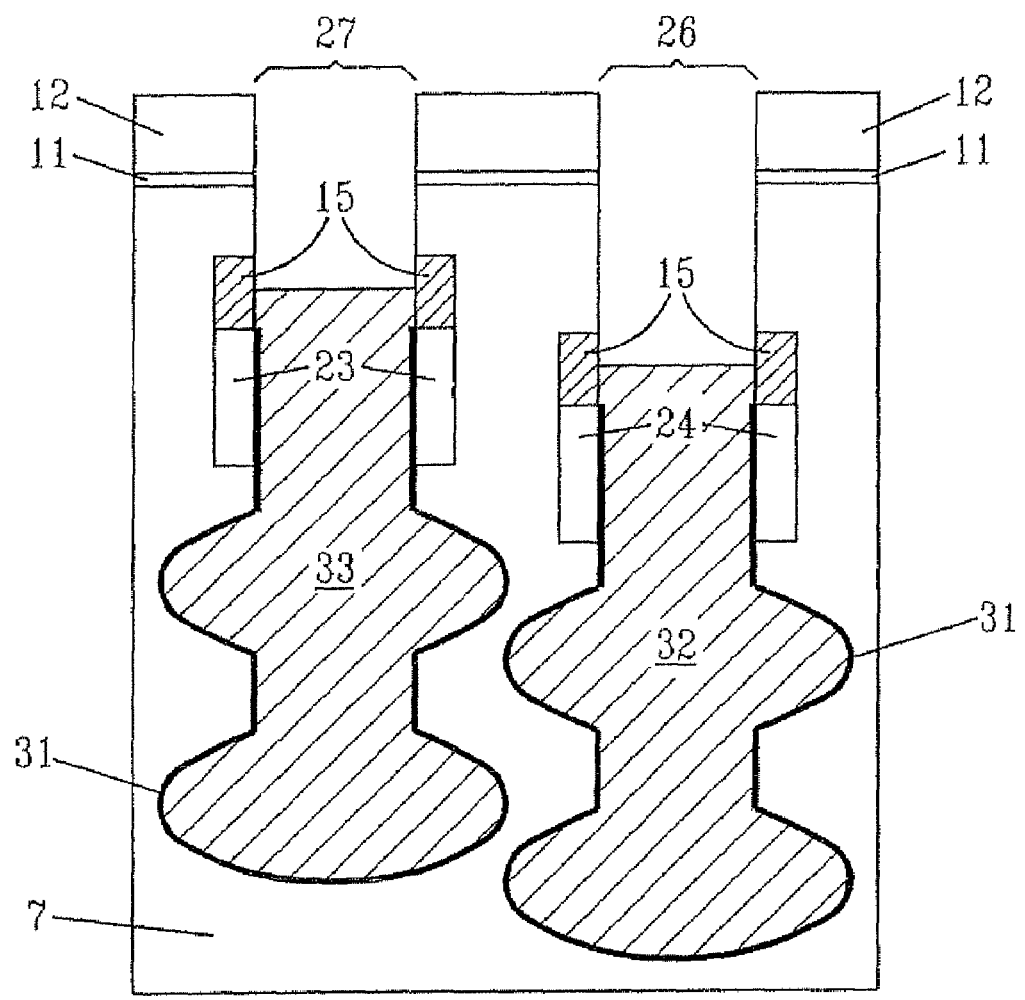

Referring to FIG. 13, buried strap regions 15 are then formed atop the recessed oxide collars 23, 24. The buried strap regions 15 function as one terminal of the source and drain regions of the subsequently formed vertical transistors 10 and are in electrical communication with the underlying capacitor. The buried strap region 15 is a thin layer of undoped or doped polysilicon, which extends into the recess in the top inside corner of the recessed oxide collar 23, 24. During subsequent thermal processes, dopants, such as arsenic, out-diffuse into the substrate 7 thereby forming the source (or drain) of the transistor, which will be formed in the upper trench. In one embodiment, dopants out-diffuse from a doped buried strap region 15. In another embodiment, when the buried strap region 15 is not doped, the dopants can out-diffuse from the doped node poly 32, 33 through the buried strap region 15.

The buried strap poly layer can be formed by a deposition and etchback process. A thin layer of thermal nitride (not shown) of approximately 10 Å can be formed prior to buried strap poly formation to prevent forming defects, such as dislocations, at the interface of the buried poly and the substrate. The etchback process can be a timed wet chemical etch comprising nitric ($HNO_3$)/hydrofluoric (HF) or ammonia.

Figure 14:
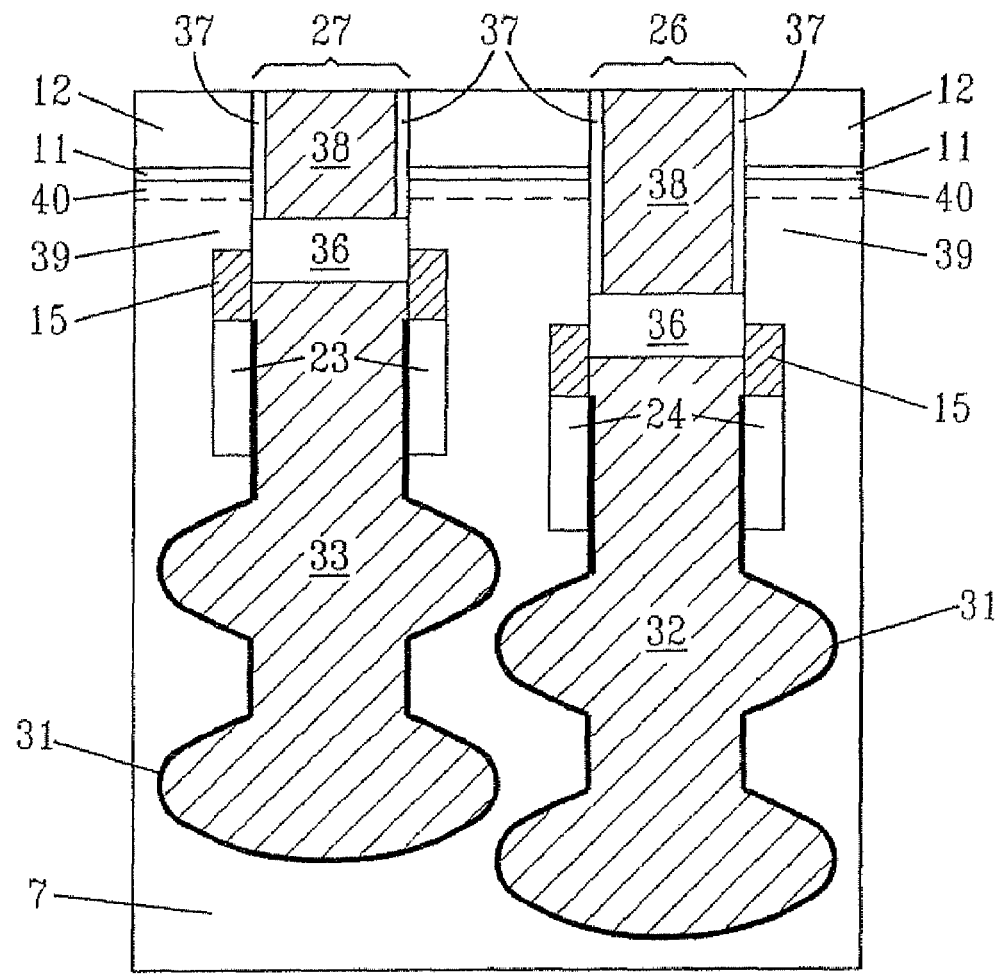

Referring to FIG. 14, a trench top oxide (TTO) layer 36 is formed atop the polysilicon nodes 32, 33. Preferably, the trench top oxide (TTO) 36 may comprise $SiO_2$. The trench top oxide (TTO) 36 can be deposited by high-density plasma (HDP) CVD and may have a thickness of approximately 250 Å on trench sidewall and 700 Å on top of polysilicon nodes 32, 33, due to the anisotropic nature of the high-density plasma (HDP) CVD process (The deposition rate of the HPD process is higher in the vertical direction than in the lateral direction). A sacrificial layer of thermal oxide (not shown), having a thickness of approximately 50 Å, can be optionally formed before TTO 36 deposition to protect the trench sidewall from the attack of plasma during the HDPCVD process.

Substantially all of the oxide on the trench sidewall is then removed by a timed wet etch comprising buffered HF (BHF) or diluted HF (DHF). The timed wet etch can remove approximately the same amount of HDP oxide from the trench top oxide (TTO) 36. Therefore, following the timed wet etch the resulting thickness of the trench top oxide (TTO) 36 is on the order of approximately 350 Å. If the optional sacrificial layer of thermal oxide is present, the sacrificial thermal oxide layer can be removed along with the HDP oxide by a buffered HF (BHF) or diluted HF (DHF) solution.

Gate dielectric layers 37 are then formed by thermal oxidation. Alternatively, the gate dielectric regions may be formed by deposition processes. Suitable examples of gate dielectrics that can be employed as the gate dielectric 37 include, but are not limited to: $SiO_2$, $Si_3N_4$, SiON, $Al_2O_3$, $ZrO_2$, $HfO_2$, $Ta_2O_3$, $TiO_2$, perovskite-type oxides or combinations and multi-layers thereof. The thickness of the gate dielectric 37 may range from about 3 nm to about 10 nm, preferably being 5 nm to 6 nm.

Still referring to FIG. 14, a gate conductor layer 38 is then deposited by conventional deposition processes, such chemical vapor deposition (CVD), plasma-assisted CVD, high-density plasma chemical vapor deposition (HDPCVD)), plating, sputtering, evaporation and chemical solution deposition. The gate conductor material is preferably doped polysilicon but may also be comprised of Ge, SiGe, SiGeC, metal suicides, metallic nitrides, metals (for example W, Ir, Re, Ru, Ti, Ta, Ht Mo, Nb, Ni, Al) or other conductive materials. Following deposition, the gate conductor layer 38 is then planarized to the top surface of the nitride layer 12 by conventional planarization methods, such as chemical mechanical planarization (CMP).

The channel 39 of the vertical transistor 10 and the drain 40 may then be formed by ion implantation. The channel 39 may be formed by implanting p-type dopants with an implant energy sufficient to position the dopants atop the N-type buried strap 15. P-type dopants in a silicon substrate 7 include elements from Group III of the Periodic Table of Elements, preferably being boron (B). Implanting N-type dopants with implant energy sufficient to position the N-type dopants atop the channel 39 may form the drain 40 of the vertical transistor 10. Conventional processes may then be utilized to provide electrical communication to the memory array.

Figure 15:
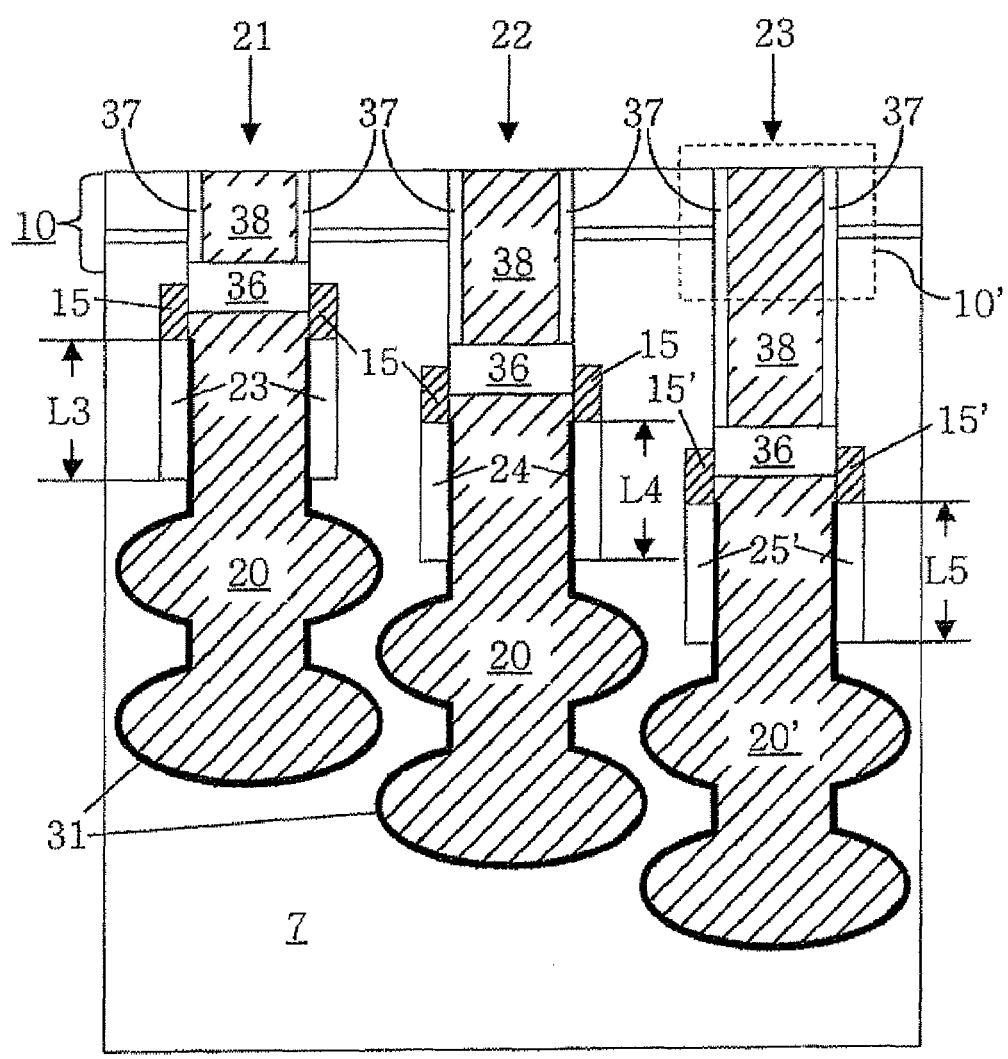
FIG. 15 illustrates (through cross-sectional view) another embodiment of the memory array of the present invention comprising a further-offset buried strap.

Referring to FIG. 15, another memory array according to another embodiment of the present invention includes at least one other-type memory device 23, each of the at least one other-type memory device 23 comprising another transistor 10', another underlying capacitor 20', a further-offset buried strap 15', and another collar region 25 with another vertical length L5, wherein the further-offset buried strap 15' is located at another depth that is different from the first depth and from the second depth and is positioned on the another collar region and is in electrical contact with both the another transistor and the another underlying capacitor, and the another vertical length L5 is equal to the first vertical length L3. The structure of the another memory array containing the at least one other-type memory device is formed by repeated applications of the methods described above that is used to differentiate the depth of the first-type memory trench device 21 and the second-type memory trench device 22.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a memory array comprising:

etching a substrate to provide a first trench having an initial depth and a second trench having an intermediate depth to produce an offset in a vertical dimension between said first trench region and said second trench region;

forming sacrificial sidewall spacers to said initial depth of said first trench and to said intermediate depth of said second trench;

etching said first trench to a first collar depth and said second trench to a second collar depth, wherein said offset between said first trench and said second trench is maintained;

forming collars within said first trench and said second trench, said collars positioned underlying said sacrificial sidewall spacers within said first trench and said second trench;

forming capacitors in said first trench and said second trench, each of said capacitors extending above a bottom surface of said collars;

recessing said collars below a top surface of said capacitors, wherein recessed collars in said first trench and said second trench are of equal length;

forming buried straps atop said recessed collars in said first trench and said second trench, wherein said buried straps of said first trench are separated from said buried straps of said second trench by said offset in said vertical dimension; and forming transistors atop said capacitors in said first trench and said second trench.

2. The method of claim 1 wherein said etching said substrate to provide said first trench having said initial depth and said second trench having said intermediate depth further comprises:

providing a film stack atop said substrate;

patterning said film stack to expose regions of said substrate where said first trench and said second trench are subsequently formed;

applying a block mask atop said regions of said substrate where said first trench is subsequently formed and etching said second trench;

stripping said block mask; and etching said second trench to said intermediate depth and said first trench to said initial depth.

3. The method of claim 1 wherein said collars are formed by local oxidation of silicon.

4. The method of claim 1 wherein forming said capacitors further comprises:

etching said first trench to a first capacitor depth and said second trench to a second capacitor depth, wherein said offset between said first trench and second trench is maintained;

depositing a node dielectric within said first trench and said second trench;

forming polysilicon within said first trench and said second trench;

recessing said polysilicon until said polysilicon within said first trench is recessed below a top surface of said collar within said first trench;

applying a block mask atop said first trench region; and recessing said polysilicon within said second trench until said polysilicon is recessed below a top surface of said collar within said second trench.

5. The method of claim 1 wherein said capacitors further include bottled regions formed by an etch process having selective alternating anisotropic and isotropic etch properties.

6. The method of claim 4 wherein said recessing said collars comprises:

removing said sacrificial sidewall spacers and an upper portion of said node dielectric by selective etch; and selectively etching said collars to produce divots in said first trench and said second trench, wherein said divots within said first trench are separated from said divots within said second trench by said offset in said vertical dimension.

7. The method of claim 6 wherein said forming said buried straps comprises:

depositing strap polysilicon within said first trench and said second trench; and etching back said strap polysilicon, wherein a remaining portion of said strap polysilicon is positioned within said divots.

8. The method of claim 1 further comprising a trench top oxide positioned between said capacitors in said first trench and said second trench and said transistors in said first trench and said second trench.

9. The method of claim 1 wherein said forming said transistors comprises:

forming gate dielectrics on exposed sidewalls of said first trench and said second trench;

forming gate regions within said first trench and said second trench;

doping said substrate atop said buried straps to provide a channel; and doping said substrate atop said channel to provide a drain.

10. The method of claim 1 further comprising forming another trench having another offset buried strap atop equal length collars electrically connecting another transistor to another capacitor.

* * * * *